US007285963B2

(12) United States Patent
Talanov et al.

(10) Patent No.: US 7,285,963 B2
(45) Date of Patent: Oct. 23, 2007

(54) METHOD AND SYSTEM FOR MEASUREMENT OF DIELECTRIC CONSTANT OF THIN FILMS USING A NEAR FIELD MICROWAVE PROBE

(75) Inventors: Vladimir V. Talanov, Ellicott City, MD (US); Andrew R. Schwartz, Bethesda, MD (US); Andre Scherz, Baltimore, MD (US); Robert L. Moreland, Lothian, MD (US)

(73) Assignee: Solid State Measurements, Inc., Pittsburgh, PA (US)

( * ) Notice: Subject to any disclaimer, the term of this patent is extended or adjusted under 35 U.S.C. 154(b) by 186 days.

(21) Appl. No.: 11/101,517

(22) Filed: Apr. 8, 2005

(65) Prior Publication Data

US 2005/0230619 A1    Oct. 20, 2005

Related U.S. Application Data

(60) Provisional application No. 60/560,590, filed on Apr. 9, 2004.

(51) Int. Cl.
*H01P 7/00* (2006.01)
*G01R 27/04* (2006.01)
(52) U.S. Cl. ................. 324/635; 324/633; 324/601
(58) Field of Classification Search ............ 324/636, 324/601, 634, 635, 633
See application file for complete search history.

(56) References Cited

U.S. PATENT DOCUMENTS

| | | | | |
|---|---|---|---|---|
| 5,256,978 | A | * | 10/1993 | Rose ........................ 324/601 |
| 5,397,993 | A | * | 3/1995 | Tews et al. ................. 324/634 |
| 5,502,392 | A | | 3/1996 | Arjavalingam et al. |
| 5,508,627 | A | | 4/1996 | Patterson |
| 5,543,386 | A | | 8/1996 | Findikoglu et al. |
| 5,821,410 | A | | 10/1998 | Xiang et al. |
| 5,900,618 | A | | 5/1999 | Anlage et al. |
| 5,936,237 | A | | 8/1999 | Van Der Weide |
| 6,173,604 | B1 | | 1/2001 | Xiang et al. |
| 6,285,811 | B1 | | 9/2001 | Aggarwal et al. |
| 6,376,836 | B1 | * | 4/2002 | Anlage et al. ............. 250/234 |
| 6,496,018 | B1 | * | 12/2002 | Nagata et al. ............. 324/636 |

(Continued)

OTHER PUBLICATIONS

William R. Smythe, "Static and Dynamic Electricity", Third Edition, McGraw-Hill Book Company, NY. 1968, pp. 128-132, 227.

(Continued)

*Primary Examiner*—Anjan Deb
(74) *Attorney, Agent, or Firm*—The Webb Law Firm

(57) ABSTRACT

A measurement technique based on a microwave near-field scanning probe is developed for non-contact measurement of dielectric constant of low-k films. The technique is non-destructive, non-invasive and can be used on both porous and non-porous dielectrics. The technique is based on measurement of resonant frequency shift of the near-field microwave resonator for a plurality of calibration samples vs. distance between the probe tip and the sample to construct a calibration curve. Probe resonance frequency shift measured for the sample under study vs. tip-sample separation is fitted into the calibration curve to extract the dielectric constant of the sample under study. The calibration permits obtaining a linear calibration curve in order to simplify the extraction of the dielectric constant of the sample under study.

20 Claims, 8 Drawing Sheets

U.S. PATENT DOCUMENTS

| | | | |
|---|---|---|---|
| 6,532,806 B1* | 3/2003 | Xiang et al. | 73/105 |
| 6,597,185 B1 | 7/2003 | Talanov et al. | |
| 6,614,227 B2* | 9/2003 | Ookubo | 324/316 |
| 6,856,140 B2 | 2/2005 | Talanov et al. | |
| 2002/0153909 A1 | 10/2002 | Petersen et al. | |
| 2005/0150278 A1* | 7/2005 | Troxler et al. | 73/78 |
| 2006/0087305 A1* | 4/2006 | Talanov et al. | 324/71.1 |
| 2006/0288782 A1* | 12/2006 | Sawamoto et al. | 73/579 |

OTHER PUBLICATIONS

M. Fee et al., "Scanning Electromagnetic Transmission Line Microscope With Sub-Wavelength Resolution" Optics Communications, vol. 69, No. 34, Jan. 1, 1989, pp. 219-224.

James Baker-Jarvis et al., "Analysis of an Open-Ended Coaxial Probe with Lift-Off for Nondestructive Testing", IEEE Transactions on Instrumentation and Measurement, vol. 43, No. 05, Oct. 1994, pp. 711-717.

D.E. Steinhauer et al., "Surface Resistance Imaging with a Scanning Near-Field Microwave Microscope", Applied Physics Letters, vol. 71, No. 12, Sep. 22, 1997, pp. 1736-1738.

Saeed Pilvar et al., "Focused Ion-Beam Fabrication of Fiber Probes with Well-Defined Apertures for Use in Near-Field Scanning Optical Microscopy", Applied Physics Letters, vol. 72, No. 24, Jun. 15, 1998, pp. 3133-3155.

Paul J. Petersan et al., "Measurement of Resonant Frequency and Quality Factor of Microwave Resonators: Comparision of Methods", Journal of Applied Physics, vol. 84, No. 06, Sep. 15, 1998, pp. 3392-3402.

C. Gao et al., "Quantitative Microwave Near-Field Microscopy of Dielectric Properties", Review of Scientific Intruments, vol. 69, No. 11, Nov. 1998, pp. 3846-3851.

Fred Duewer et al., "Tip-Sample Distance Feedback Control in a Scanning Evanescent Microwave Microscope", Applied Physics Letters, vol. 74, No. 18, May 3, 1999, pp. 2696-2698.

M. Tabib-Azar et al., "Nondestructive Superresolution Imaging of Defects and Nonuniformities In Metals, Semiconductors, Dielectrics, Composites, and Plants Using Evanescent Microwaves", Review of Scientific Instruments, vol. 70, No. 06, Jun. 1999, pp. 2783-2792.

Rimma Dekhter et al., "Investigationg Material and Functional Properties of Static Random Access Memories Using Cantilevered Glass Multiple-Wire Force-Sensing Thermal Probes", Applied Physics Letters, vol. 77, No. 26, Dec. 25, 2000, pp. 4425-4427.

"International Technology Roadmap for Semiconductors—Interconnect", Semiconductor Industry Association, 2001, http://public.itrs.net/Files/2001ITRS/Interconnect.pdf.

J. Iacoponi, "Status and Future prospects for low k interconnect metrology", Presented at the Characterization and Metrology for ULSI Technology conference, Austin, TX, 2003.

* cited by examiner

METHOD AND SYSTEM FOR MEASUREMENT OF DIELECTRIC CONSTANT OF THIN FILMS USING A NEAR FIELD MICROWAVE PROBE

This Utility Patent Application is based on Provisional Patent Application Ser. No. #60/560,590, filed 9 Apr. 2004.

FIELD OF THE INVENTION

The present invention relates to measurement techniques. In particular, this invention directs itself to a technique for highly localized measurements of dielectric constants of thin films using near field microwave probes.

More in particular, the present invention is directed to non-contact, non-destructive, and non-invasive measurements of the dielectric constant of low K films which can be used on both porous and non-porous dielectrics. The concept of the present invention is based on a balanced two conductor transmission line resonator which provides confinement of a probing field within a sharply defined sampling volume of the material under study to yield a localized determination of the material's dielectric constant.

The present invention is also directed to a technique for quantitative measurements of a material's dielectric constant based on the probe calibration permitting the construction of a linear calibration curve that substantially increases the preciseness of the dielectric constant measurement.

BACKGROUND OF THE INVENTION

Rapid advancements are projected over the next decade to new materials for use in the interconnects: from aluminum to copper to reduce the resistance of the metal wires, and from $SiO_2$ to dielectrics with lower dielectric constant k, commonly known as 'low-k' materials, for reduction of delay times on interconnect wires and minimization of crosstalk between wires. As stated in Semiconductor Industry Association, *International Technology Roadmap for Semiconductors*, Austin, Tex.: International SEMATECH, 2003, "The introduction of new low-k dielectrics . . . provide[s] significant process integration challenges", and " . . . will greatly challenge metrology for on-chip interconnect development and manufacture". In addition, "design of interconnect structures requires measurement of the high frequency dielectric constant of low-k materials. High frequency testing of interconnect structures must characterize the effects of clock harmonics, skin effects, and crosstalk". In general, such methodology should be non-destructive, non-contaminating, and provide real time/rapid data collection and analysis. (J. Iacoponi, Presented at the Characterization and Metrology for ULSI Technology conference, Austin, Tex., are performed on simplified structures or monitor wafers and are often destructive.

Currently, the two techniques most commonly used for dielectric constant measurements on blanket wafers are the Hg-probe and MIS-capacitor (D. K. Schroder, *Semiconductor Material and Device Characterization*, John Wiley & Sons, New York (1998)). Although widely employed, the Hg-probe contaminates the wafer, requires daily recalibration, is difficult to align, and cannot be used on production wafers. MIS-cap is considered more accurate than the Hg-probe, however it requires electrode patterning (e.g. destructive) and cannot be used on product wafers. The Corona discharge and Kelvin probe technique (D. K. Schroder, Meas. Sci. Technol. 12, R16 (2001)) which has traditionally been used to measure gate dielectrics is now being employed for low-k interconnect dielectrics, however, it is limited to blanket monitor wafers and there is some concern that the charging of the film surface may cause damage.

Near-field scanning microwave microscopy has proven to be a promising methodology for highly localized measurements.

One of the main goals of the near-field scanning microwave microscopy is to quantitatively measure a material's dielectric constant with high sensitivity of lateral and/or depth selectivity (i.e. to determine the material's property over a small volume while ignoring the contribution of the volume's surrounding environment). This is particularly important in measurements on complex structures, such as semiconductor devices or composite materials, where, for example, the permittivity of one line or layer must be determined without having knowledge of the properties of the neighboring lines or underlying layers.

In order to perform highly localized quantitative measurements of a material's complex permittivity at microwave frequencies by means of near-field microwave microscopy the near-field probe requires calibration. All calibration procedures currently in use for near-field microwave microscopy employ some information about the actual tip geometry which would include, for example, the tip curvature radius, etc., and further requires knowledge of the absolute tip-to-sample separation.

If there is no radiation from the tip of the probe, the response of the electrical near-field probe depends on the fringe impedance of the tip $Z_t=1/i\omega C_t$, where $C_t$ is the static capacitance of the tip of the probe. This capacitance depends on the physical geometry of the tip, the tip-to-sample separation d, and the sample's dielectric constant k (assuming the sample is uniform in contour). Thus, in order to extract the sample's dielectric constant k from the impedance of the tip $Z_t$, the tip geometry and absolute tip-to-sample separation must be known to a high degree of accuracy.

However, accurate determination of these parameters is difficult and often impractical, especially for small tips of less than or on the order of a few microns in size which are of great importance for near-field microwave microscopy. Further, analytical solutions to the problem of interaction between a near-field tip and a sample exist only for the most simple tip geometries, such as a sphere or a flush end of a coaxial line.

It is therefore highly desirable to perform quantitative measurement of a material's dielectric constant which does not require knowledge of either the actual tip geometry or the absolute tip-to-sample separation.

Accurate and precise novel measurement approach with the use of near-field microwave probe is needed to obtain a material's dielectric constant.

SUMMARY OF THE INVENTION

It is therefore an object of the present invention to provide low-k dielectric methodology based on a scanning near-field microwave probe which can achieve spatial resolution at the sub-micron scale. The subject invention is directed to an apparatus and a method for highly accurate determination of the dielectric constant of a sample under study which employs a probe capable of sharply localized measurements.

Another object of the present invention is to provide a technique for quantitative measurements of material's dielectric constant with near-field microwave probes which is independent of the actual geometry of the probe's tip and the absolute tip-to-sample separation.

It is a further object of the present invention to provide a method and apparatus for quantitative measurement of thin films' dielectric constant with near-field microwave probes which employ an independent distance control mechanism for maintaining the tip of the probe at possibly unknown but nominally equal distance from the sample surface during both the calibration procedure and the actual measurement.

It is still an object of the present invention to provide a unique calibration technique which permits construction of a linear calibration curve thereby attaining simplicity and preciseness of the dielectric constant measurements.

It is also an object of the present invention to provide a novel non-destructive non-invasive microwave near-field scanning probe technique for non-contact measurements of the dielectric constant of low-k films which can be used on both porous and non-porous dielectrics forming either single-layered or multi-layered micro-structures.

The present invention represents a method of measurement of dielectric constant of a sample under study which includes the steps of:

positioning the tip of a near-field microwave probe (NMP) a predetermined tip-sample separation do over the surface of the sample under study, measuring probe resonant frequency shift of the sample under study vs. the tip-sample separation, calibrating the near-field microwave probe on a plurality of calibration samples by positioning the tip of the near-field microwave probe at a distance substantially equal to the tip-sample separation $d_0$, and measuring probe resonant frequency shift for each calibration sample vs. the tip-sample separation, constructing a calibration curve based on calibration data points acquired as a result of the calibration of the near field microwave probe for the plurality of calibration samples, fitting the probe resonant frequency shift of the sample under study into the calibration curve, and extracting the dielectric constant of the sample under study.

The calibration samples include calibration samples having dielectric constant k>>1, a calibration sample with the dielectric constant equal to dielectric constant of the substrate of the sample under test, and a set of thin films of a thickness ranging around the thickness of the sample under study. Each of these thin films has a dielectric constant that is close to the dielectric constant of the film under study. The thin films may include, for example, $SiO_2$ films, thermal oxide (TOX) films, Teflon, sapphire, MgO, or other calibration materials.

The calibration curve is created as a result of interpolating the calibration data points either by a standard interpolation method, or by fitting calibration data points to a second or higher order polynomial function, or using the analytical function describing behavior of the tip of the near field microwave probe.

Although, the calibration curve may be the curve having a positive or negative second derivative, it is preferable that the calibration curve behave substantially in a linear fashion.

In order to obtain a linear calibration curve, in the method of the present invention, a tip-sample separation D* is determined at which the calibration curve is linear. The probe resonant frequency shift of the sample under study is further measured at the tip-sample separation D* which is determined by the following steps:

measuring the probe resonant frequency shift vs. tip-sample separation $d>d_0$ for a plurality of calibration films of different thicknesses, determining a tip-sample separation D* at which the calibration curve measured for the plurality of calibration films behaves linearly, determining dependence between the D* and the thickness of each of the calibration films, determining tip-sample separation D* corresponding to the thickness of the sample under study based on the relationship between the D* and the thickness of the calibration films.

The present invention provides a system for measurement of dielectric constant of a sample under study which includes:

a sample under study, a plurality of calibration samples, a near field microwave probe having a tip, a distance control unit operatively coupled to the near field microwave probe to control tip-sample separation, measuring electronics for measuring resonance frequency shift of the near field microwave probe for the sample under study and for the plurality of calibration samples, and a processor coupled to the near field microwave probe and the distance control unit to calculate the dielectric constant of the sample under study based on resonance frequency shift measurements for the sample and the plurality of calibration samples.

The processor includes a calibration unit for constructing a calibration curve based on calibration data points acquired as a result of calibrating of the near field microwave probe for the plurality of the calibration samples. Particularly, the calibration unit constructs the calibration curve based on measurements of the resonance frequency shift vs. tip-sample separation for the plurality of calibration samples. The processor further fits the resonance frequency shift measured vs. tip-sample separation for the sample into the calibration curve to extract the dielectric constant of the sample.

The near field microwave probe includes a balanced two conductor transmission line resonator which includes at least a pair of conductors extending in spaced relationship therebetween and spaced apart by a dielectric media.

Preferably, the calibration unit determines a tip-sample separation D* at which the calibration curve is substantially a linear calibration curve. The system measures the probe resonant frequency shift for the sample under study at the determined tip-sample separation D*.

Separation between the probe and the sample under study, as well as the separation between the probe and the calibration samples may be controlled by a shear force distance control mechanism in which the motion of the probe tip is detected by an optical beam deflection technique for a piezo element or alternatively by a phase-or-amplitude-locked loop for a quartz tuning-fork oscillator. A feedback loop maintains a constant motion of the probe tip at a value less than a predetermined threshold which permits precise distance control down to 1 nm. These and other features and advantages of the present invention will be fully understood and appreciated from the following detailed description of the accompanying Drawings.

DESCRIPTION OF THE PREFERRED EMBODIMENT

Figure 1:
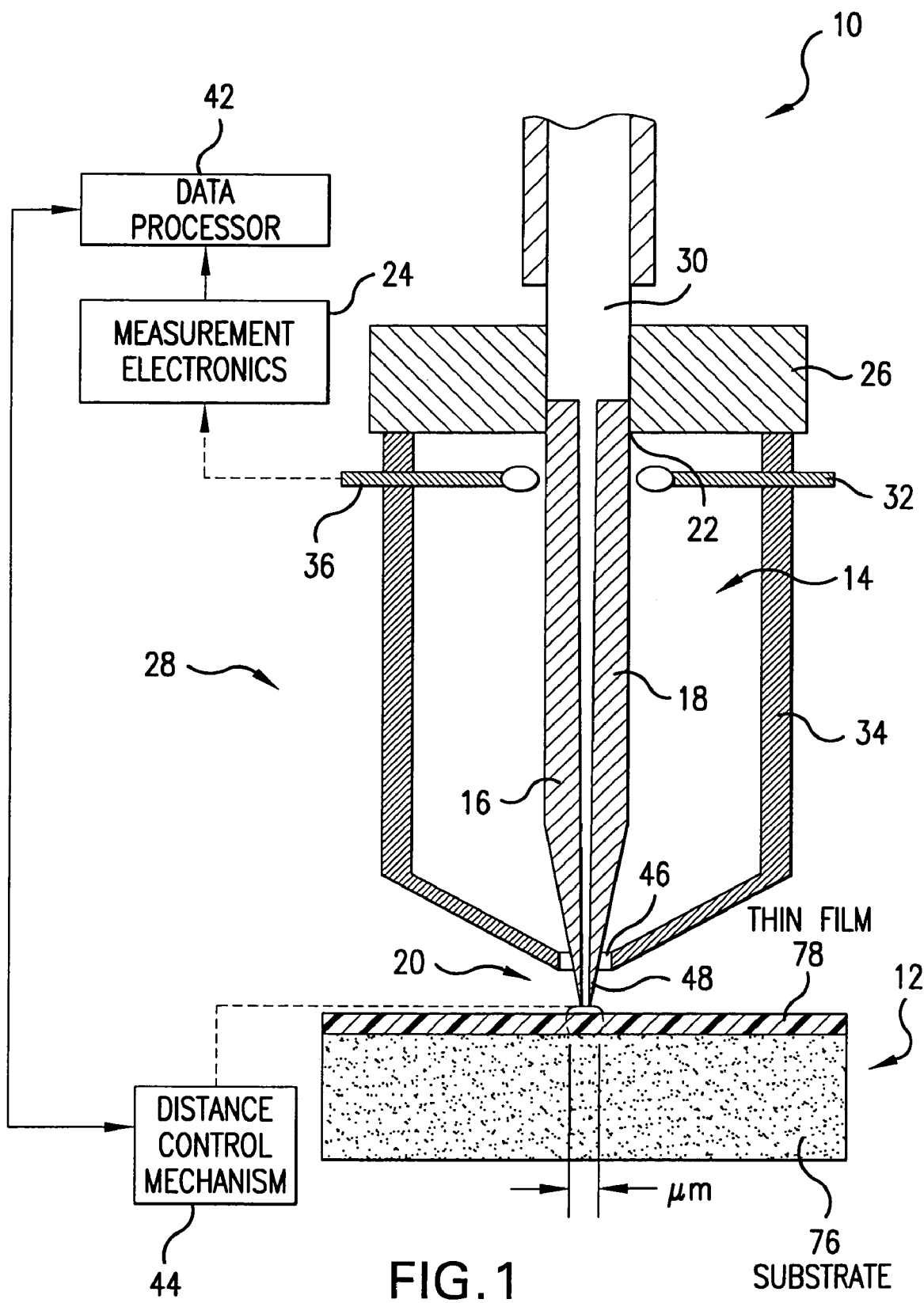
FIG. 1 is a schematic representation of the near field scanning microwave probe system for dielectric constant measurement of the present invention.
Figure 2:
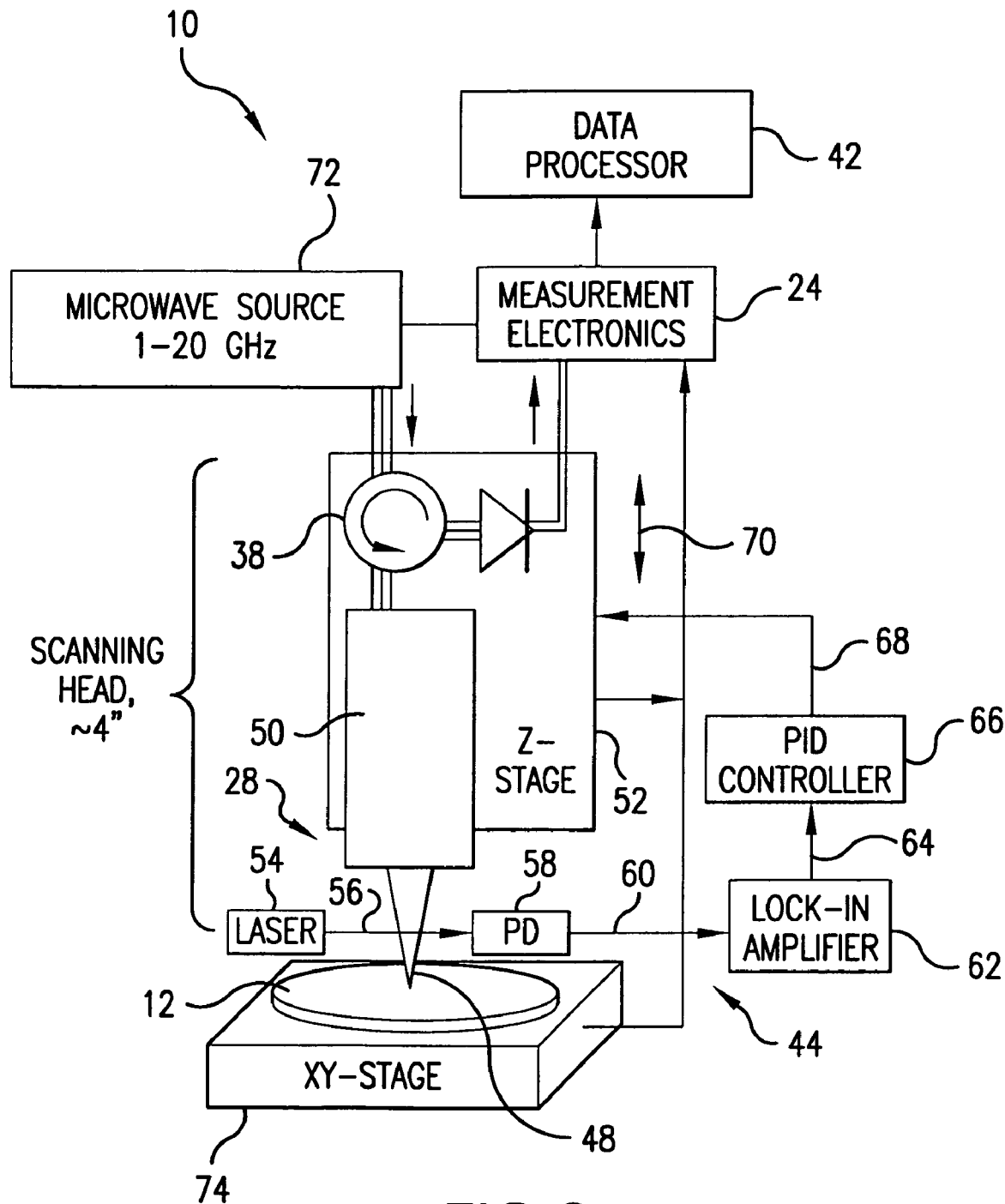
FIG. 2 is a schematic representation of the experimental set-up of the measurement system of the present invention.

Referring to FIGS. 1 and 2, there is shown a near-field microwave probe system 10 for non-destructive determination of the dielectric constant (permittivity) of a sample 12 which is based on a balanced two conductor transmission line 14 which includes two spatially separated symmetrically arranged electrical conductors 16 and 18 of circular, semi-circular, rectangular, or similar cross-section contour. The conductors may be formed from copper, tungsten STM tips, gold, silver, or aluminum strips deposited onto a glass fiber as will be detailed in following paragraphs. A probing end 20 of the transmission line 14 is brought in close proximity to the sample 12 and an opposite end 22 of the transmission line 14 is either connected to measurement electronics 24 for the determination of a reflected signal's phase and magnitude, or to a terminating plate 26 to form a resonator structure 28 for the purposes described in the following paragraphs.

The probe 10 is primarily envisioned in two embodiments:

A. In operation as a transmission line for feeding a signal to the sample 12 and measuring the phase and magnitude of the reflected signal. This transmission line is operated either in the odd mode, i.e., in a mode in which the current flow in one of the two conductors 16, 18 is opposite in direction to that in the other conductor; or in an even mode if a conducting sheath is used for enveloping the transmission line 14. In this embodiment, the behavior of the transmission line 14 is analogous to the case of symmetrically coupled microstrip lines within an enclosure. When operated in the even mode, the interaction between the sample 12 and the probe 20 is similar to the coaxial symmetries known to those skilled in the art. Measurements of the phase and magnitude of the reflected signal by means of the transmission line arrangement are broadband in frequency but are generally not satisfactory with respect to sensitivity to the sample properties and require additional expensive and complex electronic equipment such as vector network analyzers.

B. In order to obtain a more sensitive and accurate result while employing less expensive equipment, the probe 10 of the present invention provides a resonator structure 28 which is formed by a portion of the transmission line 14 with the conductors 16, 18 separated by a dielectric medium 30. The dielectric medium 30 may include air, a circulating fluid for temperature stabilization, or high dielectric constant materials for size reduction.

The probing end 20 of the resonator structure 28 is brought into proximity to the sample 12 (which may be ion-implanted silicon, metals, dielectric, metal films, or dielectric films on a wide variety of substrates) with the opposite end 22 of the transmission line resonator structure 28 being electrically shorted or opened. The resonator structure 28 is formed in order to measure the resonant frequency and the probe resonant frequency shift of the resonator structure 28 for determination of the dielectric constant (permittivity) of the sample 12.

The spacing between the two conductors 16, 18 and their cross-section must be properly chosen in order to maintain a resonator quality factor Q high enough for accurate measurements of the sample induced changes in the resonant frequency and the Q factor. As an example, the spacing between the conductors 16 and 18 may be on the order of or greater than 1 mm for Q>1000 at 10 GHz.

When the probe 10 of the present invention is operated as the resonator, the odd and even modes of operation in general result in two different resonant frequencies due to dispersion of the signal and may therefore be separated in the frequency domain in a powered mode as well as being monitored independently. The dielectric medium 30 sandwiched between the conductors 16 and 18 serves to enhance such dispersion.

The coupling to the resonator 28 is accomplished by a coupling loop 32 positioned close to the resonator 28 and internal to an optional conducting sheath 34. A second coupling loop 36 may be used for the measurement electronics 24 schematically shown in FIGS. 1 and 2. Alternatively, a circulator 38 (or directional coupler), shown in FIG. 2 may be used to separate the signal reflected from the resonator 28 back to the feed loop 32. The resonant frequency and quality factor Q of the resonator structure 28 may be determined by Fast Frequency Sweep (FFS) technique or any other standard method for measurement of resonant frequency and Q-factor, such as, for example, Frequency Tracking based on either phase or amplitude detection.

All calculations are carried out by data processor 42 based on predetermined formulas applied to the measured data. The processor 42 additionally controls the overall performance and operation of the measurement electronics 24 as well as the distance control mechanism 44.

The resonator structure 28 forms a $(2n+1)\lambda/4$ or $(n+1)\lambda/2$ resonator (n=0, 1, 2, . . . ), and its length is determined by the frequency of the lowest mode, e.g., about 7.5 mm for the $\lambda/2$ mode operating at 10 GHz.

The resonator structure 28 may be enclosed in a cylindrical or other shaped sheath 34 formed of a highly conductive material (such as Cu, Au, Ag, Al). The sheath 34 eliminates both radiation from the resonator 28 and the effect of the probe environment on the resonator characteristics. In particular, the variation influence of moving parts in the proximity of the resonator 28 is eliminated. The sheath 34 has an opening 46 near the sample area that permits efficient coupling of the sample 12 to the resonator 28 and thus permits the resonant frequency and Q factor to be dependent on the sample microwave permittivity. In situations where the spacing between the conductors 16 and 18 is small in comparison to the inner diameter of the sheath, the resonator properties are substantially unaffected by the sheath presence. The upper part of the sheath 34 makes electrical contact with the terminating plate 26. The bottom part of the sheath may have a conical shape in order to provide clear physical and visual access to the sampling area.

As discussed in previous paragraphs, the probing end 20 of the resonator structure 28, specifically tip 48 thereof, is brought into close proximity to the sample 12 for measurement purposes. The geometry of the tip 48, as well as the separation between the tip 48 and the sample 12 present information vital to calibration procedures used for near-field microwave microscopy for quantitative measurements of a material's dielectric constant (permittivity). Since the accurate determination of these parameters is difficult and often impractical, especially for the very small tips of less than, or on the order of a few microns in size of the transmission line 14 shown in FIG. 1, the quantitative measurement of dielectric constant of the material is performed without knowledge of either the actual tip geometry or the absolute tip-to-sample separation by means of employing the independent distance control mechanism 44 which is schematically shown in FIG. 1 and in more detail in FIG. 2.

The distance control measurement 44 of the present invention may be one of many distance control mechanisms known to those skilled in the art, but it is envisioned as a shear-force based distance control mechanism by means of which the tip 48 of the resonant structure 28 is maintained at an unknown, but nominally the same or equal distance from the sample surface during both the calibration procedure and the actual measurement process. Combined with the appropriate theory describing the probe-to-sample interaction in terms of solely the geometry, the distance control mechanism 44 of the present invention has been found to yield accurate quantitative results.

In order to perform quantitative measurements with near-field microwave probes, shown in FIGS. 1 and 2, it is essential that the separation between the probe tip 48 and the sample 12 be precisely controlled. Without precise control of this distance, changes in sample properties (permittivity) cannot be distinguished from changes in such a distance. To control the distance between the tip 48 and the sample 12, the distance control unit 44, is incorporated into the measurement scheme of the near-field microwave probe system. The distance control unit 44 is coupled bi-directionally to the data processor 42 for data exchange and for control over the operation of the distance control mechanism 44.

Shear force based distance control mechanism 44 is a distance control mechanism applicable for use in near-field scanning optical microscopy (NSOM). The basic concept of the shear force distance control mechanism is that a probe, specifically the tip 48, is flexible and is mounted onto and dithered by a piezoelectric element or a quartz tuning-fork oscillator (TFO) with an amplitude from a few nanometers down to a few angstroms. As the tip 48 of such a probe is brought into close proximity to the sample surface 12, the amplitude of the tip oscillations is damped by interactions between the tip 48 and the sample surface 12. The motion of the tip is detected by an optical beam deflection technique for the piezo element or by a phase-or-amplitude-locked loop for the tuning fork oscillator (TFO).

In the measuring technique of the present invention, as shown in FIG. 2, a housing 50 of the microwave probe (resonator) 28 is attached to a dithering piezoelectric element (not shown), which in turn is supported by a fine piezo Z-stage 52. Thus, the tip 48 is dithered by the piezoelectric element with an amplitude ranging from a few nanometers down to a few angstroms.

The motion of the tip 48 is detected by an optical beam deflection unit which includes a laser 54 generating a laser beam 56 directed via the oscillating tip 48 to a photodetector (PD) 58. As the tip 48 is brought into close proximity to the sample surface 12, the amplitude of the tip oscillations is changed, i.e., damped, by interactions between the tip 48 and the sample surface 12 which is detected by the photodetector 58.

Responsive to the change of the amplitude of the tip oscillations, the photodetector 58 generates an output signal 60 indicative of the change in tip-to-sample separation. The signal 60 of the photodetector 56 is supplied to an input of a lock-in amplifier 62, which responsively generates an output control signal 64 indicative of unwanted changes in the separation between the tip 48 and the sample 12. Another generated signal from an oscillator output of the lock-in amplifier 62 is fed to the dithering element for maintaining the generation of oscillations thereat. The control signal 64 is fed from the output of the lock-in amplifier 62 to a PID (Proportional Integral Derivative) controller 66 which generates in response thereto a control signal 68 which is fed to the fine piezo Z-stage 52 for changing the position thereof along the section shown by the arrow 70 so that the probe attached to the fine piezo Z-stage 52, through the dithering element, will adjust its position with respect to the sample 12 in order to reach a predetermined separation between the tip 48 and the sample 12.

The photodetector 58, the lock-in amplifier 62, the PID controller 66, and the fine piezo Z stage 52, in combination with the laser 54 form a feedback loop which maintains the amplitude of the oscillations of the tip 48 of the probe 10 fixed at a value less than a predetermined maximum amplitude of oscillations, and thus, permits precise distance control down to approximately 1 nm.

The height of the tip 48 over the samples 12, at which the distance control may be performed, is a function of the amplitude of the tip oscillation whereby the smaller the amplitude of oscillations, the smaller the distance attained.

In the apparatus of the present invention, the successful integration of the shear force distance control mechanism 44 with both coaxial probes (on the order of 100 microns) and with dielectric wire-based probes (with apertures down to 1 micron) are attainable with an achieved precision down to 2 nm. Such a precise distance control between the tip 48 and the sample 12 during the measurements of the dielectric constant of the material of the sample 12 is an important part of the measurement process of the present invention since the distance between the tip 48 and the sample 12 is to be maintained at substantially the same during the measurement and calibration routines.

The dielectric support member may be in the form of any of the following embodiments:

a) Optical fiber with exposed cladding, with bare (untapered) cladding diameter in the range of 10 μm to 10 mm. The fiber may be formed from an insulating material that can be tapered by means of etching and/or heating/pulling and has a dielectric loss tangent $\leq 10^{-1}$ at the operating frequency (e.g. quartz, sapphire, glass, etc.)

b) Dielectric rod (substantially circular in cross-section) from approximately 10 µm to 10 mm in outer diameter formed from an insulating material that can be tapered by means of etching and/or heating/pulling and has a dielectric loss tangent $\leq 10^{-1}$ at the operating frequency (e.g. quartz, sapphire, glass, etc.)

c) Dielectric tube (micropipette, etc.) from 10 µm to 10 mm in outer diameter and appropriate inner diameter formed from an insulating material that can be tapered by means of etching and/or heating/pulling, and has a dielectric loss tangent $\leq 10^{-1}$ at the operating frequency (e.g. quartz, sapphire, glass, etc.)

d) Dielectric tube (micropipette, etc.) from 10 µm to 10 mm in outer diameter and appropriate inner diameter formed from an insulating material that can be tapered by means of etching and/or heating/pulling and further has a dielectric loss tangent $\leq 10^{-1}$ at the operating frequency (e.g. quartz, sapphire, glass, etc.) with an optical fiber inserted into the tube.

e) Dielectric bar of square, rectangular, pentagonal, hexagonal, octagonal, or other polygonal contour, etc. cross-section with the cross-section linear dimensions from 10 µm to 10 mm formed from an insulating material that can be tapered by means of etching and/or heating/pulling and has a dielectric loss tangent $\leq 10^{-1}$ at the operating frequency (e.g. quartz, sapphire, glass, etc.)

f) Multi-barrel dielectric tubing (with the number of barrels from 2 to 20) or Theta-tube formed from an insulator that can be tapered by means of etching and/or heating/pulling and which has a dielectric loss tangent $\leq 10^{-1}$ at the operating frequency (e.g. quartz, sapphire, glass, etc.) With regard to the multi-barrel dielectric tubing, one or more of the barrels may have an inserted optical fiber or metal wire.

To fabricate the near-field microwave probe shown in FIG. 1, a quartz bar with ~1×1 mm² cross-section is tapered down to a sub-micron size using a laser-based micropipette puller. Aluminum is deposited onto two opposite sidewalls of the bar and the end of the tapered portion is cut off around 1 µm in size using a focused ion beam (FIB) technique which provides a clean tip. The entire structure forms a tapered balanced parallel-plate transmission line shown in FIG. 1, with open end and no cut-off frequency.

Numerical simulations using Ansoft's High Frequency Structure Simulator (HFSS™), a 3D finite element package, show that the fringe E-field at the end of such a tip forms a "bubble" with diameter on the order of the tip size. Unlike the "apertureless" schemes that have been previously employed, this "apertured" approach permits quantitative measurements on a few-micron length scale where the result is insensitive to the material property outside the probing area. The balanced line geometry virtually eliminates the parasitic stray fields and reduces the amount of microwave power radiated from the tip 48 by a few orders of magnitude when compared to unbalanced coaxial probes.

When the probe tip 48 is placed in close proximity to the sample 12 under test, its fringe capacitance $C_t$ is governed by the tip geometry, the sample permittivity, and the tip-sample distance. The complex reflection coefficient from the tip may be determined as follows:

$$\Gamma \cong \exp(-i2\omega Z_0 C_t) \quad (1)$$

where ω is the operating frequency, $Z_0$ is the line characteristic impedance, and $\omega Z_0 C_t \ll 1$. In the experimental set-up shown in FIG. 2, in order to increase the measurement sensitivity the transmission line 14 is formed into a half-lambda resonator 28 which is accomplished by etching the back end of the aluminum strips to the appropriate length. The resonator 28 has a resonant frequency F~4 GHz and an unloaded quality factor Q~100. A conventional magnetic loop is used to couple the microwave signal from a microwave source 72. The resonator 28 is packaged inside the metallic enclosure 34 with the tapered portion protruding externally through the clear hole 46 in the enclosure wall. The probe resonant frequency F is experimentally determined from the minimum in the probe reflection coefficient $S_{11}$ using a microwave reflectometer with resolution down to 100 Hz.

From Eq. (1) the relative shift in the probe resonant frequency F is found versus change in the tip capacitance $C_t$:

$$\frac{\Delta F}{F} = -\frac{Z_0}{L\sqrt{\varepsilon_0 \mu_0 \varepsilon_{eff}}} \Delta C_t \quad (2)$$

where L is the resonator length, $\varepsilon_0$ is vacuum permittivity, $\mu_0$ is vacuum permeability, $\varepsilon_{eff}$ is the transmission line effective dielectric constant, and $Z_0$ is the line characteristic impedance. An estimate for the tip capacitance in air is $C_{t0} \sim \varepsilon_0 \alpha_t$, where $\alpha_t$ is the tip size; for $\alpha_t \sim 1$ µm $C_{t0} \sim 10$ aF. For typical probe parameters (L~25 mm, $Z_0 \sim 100\Omega$, $\varepsilon_{eff} \sim 2.5$) and a 100 Hz precision in $\Delta F$, Eq. (2) yields sensitivity to changes in the tip capacitance on the order of $3 \times 10^{-20}$ F=30 zF.

The shear-force method was used in experiments to actively control the tip-sample separation with precision down to a few nanometers. The tapered quartz bar forms a mechanical resonator with the fundamental transverse mode frequency on the order of a few kHz. The probe package is dithered at this frequency with sub-nm amplitude using a piezo tube, and the tapered portion of the tip is illuminated with a laser beam projecting onto the photodetector. The ac portion of the photo-detector output is proportional to the tip vibration amplitude, which is a strong function of the tip-sample distance d for d<100 nm. The photo-detector output is fed into a lock-in amplifier and then into a PID controller which in turn controls the amplifier for the piezo z-stage and thereby the tip-sample separation. From experimental data and theoretical estimates, the typical operating tip-sample separation is found to be on the order of 50 nm. The shear-force distance control provides typical MTBF of a tip ~$10^3$ hours.

The probe enclosure and the microwave and the shear-force circuits are installed into a measurement head that is mounted onto a highly accurate piezo-driven z-stage 52. The piezo stage is attached to a mechanical coarse z-stage, which is mounted onto a gantry bridge. A 100-300 mm wafer under test is placed onto a vacuum chuck that is scanned by the 350-mm-travel xy-stage 74. The whole setup is mounted onto a vibration-isolation platform and placed inside an enclosure to improve acoustic isolation and thermal stability.

One of the most challenging tasks in thin film methodology is to deconvolve the film 78 and substrate 76 contributions. An original approach was developed as a part of the present invention, which employs a set of variable-thickness thermal oxide (TOX) films with $k_{TOX}$=3.92 on nominally the same substrate as the low-k films under test and thicknesses ranging around the known low-k film thickness $t_f$. In this study, all the low-k samples and the TOX calibration films were fabricated on Si substrates with bulk resistivity $\rho<0.01\Omega\cdot cm$. Under the condition $\omega C_t\rho/\alpha_t<<1$ the material appears as a perfect metal for the probe for $\rho\sim0.01\Omega\cdot cm$ and 200-nm-thick film with $k=4\omega C_t\rho/\alpha_t<10^{-3}$.

The probe calibration is performed as follows. Two measurements of the frequency shift are made on the bare Si sample with $\rho$ $0.001\Omega\cdot cm$ (i.e. perfect metal): $\Delta F_{m1}=F_e-F_m[d_0]$ and $\Delta F_{m2}=F_e-F_m[d_0+t_f]$ where $F_e$ is the probe resonant frequency with no sample, $F_m[d_0]$ is the frequency measured at some tip-sample distance $d_0$ held by the shear-force distance control unit 44, and $F_m[d_0+t_f]$ is the frequency measured at the distance $d_0+t_f$. The $\Delta F_{TOX}=F_e-F_{TOX}[d_0]$ is measured for all TOX films, where $F_{TOX}[d_0]$ is the probe frequency for the TOX sample at nominally the same $d_0$. The obvious artificial point $\Delta F_{TOX}(t_{TOX}=0)=\Delta F_{m1}$ is added to the $\Delta F_{TOX}$ vs. $t_{TOX}$ data set and the result is fit to the empirical function $A(t)=a+b(1-\tanh[c(t-t_0)]$, shown in FIG. 3A, where a, b, c, and $t_0$ are the free parameters. Using this TOX calibration plot, the value $A(t_f)$ is found, and the following three-point data set is constructed in order to recover the $\Delta F_f$ vs. $\gamma_f=(k-1)/(k+1)$ dependence at fixed $t=t_f$: $\{0,\Delta F_{m2}\},\{\gamma_{TOX}, A(t_f)\}$, and $\{1,\Delta F_{m1}\}$. Here $\gamma=0$ and $\Delta F_{m2}$ are for an air "film"; and $\gamma=1$ and $\Delta F_{m1}$ are for a perfectly conducting "film".

Figure 3B:
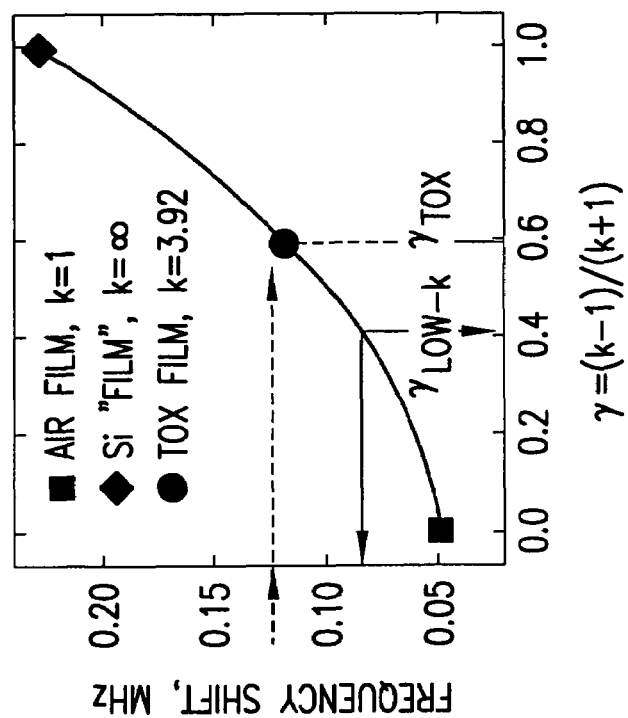
FIGS. 3A and 3B are analysis diagrams showing respectively the measured frequency shift for calibration films as a function of film thickness with the empirical fit, and the expected frequency shift as a function of $\gamma=(k-1)/(k+1)$ at a given film thickness.
Figure 3A:
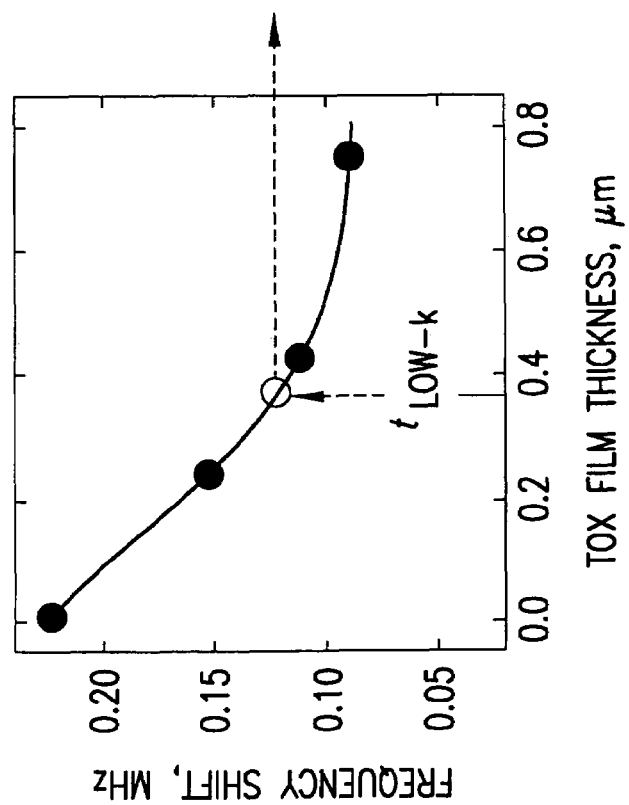

$\Delta F_f$ vs. $\gamma_f$ shown in FIG. 3B, exhibits monotonic dependence (which is generally determined by the tip geometry, tip-sample distance and film thickness) for all $0\leq\gamma\leq1$ and can be accurately approximated for $1.5<k<4$ by a second order polynomial $P(\gamma)$. To find the film's $\gamma_f$ the equation $P(\gamma_f)=\Delta F_f$ is solved and finally $k_f=(1+\gamma_f)/(1-\gamma_f)$ is determined, where $\Delta F_f=F_e-F_f[d_0]$ is measured for the low-k film. It is important to note that there is no need to know the absolute value of $d_0$, however, it must be nominally the same for all the measurements, which is provided by the independent shear-force distance control. It turns out that $\Delta F$ has the highest sensitivity to $\gamma$ around $k=2$, which makes the technique well suited for measurements on low-k materials.

The theory underlying the principles of the measurements method of the present invention is presented in further paragraphs.

Consider a single point charge placed in vacuum distance d away from the surface of a dielectric layer of thickness t with dielectric permittivity $\epsilon_{rf}$ backed by a semi-infinite dielectric with permittivity $\epsilon_{rs}$. In practice, such a sample is usually a single-layer dielectric film laying on a dielectric or metallic substrate. Using a method of a Bessel functions series expansion [W. R. Smythe, *Static and Dynamic Electricity*, McGraw-Hill, N.Y., 1968] it can be shown that the potential in vacuum above the same due to such a charge in polar coordinates is:

$$V_1(r) = \frac{q}{4\pi}\left\{[\rho^2+z^2]^{-1/2} - \gamma_f[\rho^2+(z-2d)^2]^{-1/2} - (1-\gamma_f^2)\sum_{n=0}^{\infty}(-\gamma_f)^n\gamma_s^{n+1}[\rho^2+(z-(2d\_2t(n+1)))^2]^{-1/2}\right\} \quad (3)$$

where $$\gamma_f = \frac{\varepsilon_{rf}-1}{\varepsilon_{rf}+1},$$

$$\gamma_s = \frac{\varepsilon_{rs}-\varepsilon_{rf}}{\varepsilon_{rs}+\varepsilon_{rf}}$$

$\gamma_s=1$ for the backing with $|\epsilon_{rs}|>>|\epsilon_{rf}|$. It's important to note that using the same method the solution can be generalized for the multiple dielectric layers as well.

As shown in FIG. 1, the near-field microwave probe comprises the tip formed by two conductors of arbitrary shape, which is attached to the arbitrary RF or microwave resonator. The space between the tip conductors can be partially filled with dielectric. The tip is placed in vacuum above the dielectric layer sample at some distance d away from its surface. Since the tip size is much less than the operating wavelength to consider the problem as a static approach is sufficient.

The charges +1 and −1 are placed on the tip's first and second conductor, respectively. The charges provide some surface charge density $\sigma[x,y,z;d]$ that for a particular sample and a given tip geometry depends on the tip-to-sample separation d. The potential due to this surface charge density in vacuum without the sample present is $p[x,y,z;d]$. Based on Eq. 3 the potential $V_1$ in the space above the sample due to such a tip is seen to be:

$$V_1[x,y,z] = p[x,y,z] - \gamma_f p[x,y,-(z-2d)] - (1-\gamma_f^2)\sum_{n=0}^{\infty}(-\gamma_f)^n\gamma_s^{n+1}p[x,y,-(z-(2d+2t(n+1)))] \quad (4)$$

Eq. 4 in turn yields for the mutual fringe capacitance $C_t$ between the two tip conductors in presence of the dielectric layer sample:

$$C_t^{-1} = \Delta p[0] - \gamma_f \Delta p[2d] - (1-\gamma_f^2)\sum_{n=0}^{\infty}(-\gamma_f)^n\gamma_s^{n+1}\Delta p[2d+2t(n+1)] \quad (5)$$

where $\Delta p[0]=p[x_2,y_2,z_2]-p[x_1,y_1,z_1]$ $\Delta p[2d]=p[x_2,y_2,(z_2-2d)]-p[x_1,y_1,(z_1\_2d)]$ $\Delta p[2d+2t(n+1)]=p[x_2,y_2,z_2-(2d+2t(n+1))]-p[x_1,y_1,z_1-(2d+2t(n+1))]$ and $(x_1,y_1,z_1)$ and $(x_2,y_2,z_2)$ are the two points located somewhere on the surface of the first and the second tip conductors, respectively. Eq. 5 is exact and has the structure of an infinite series where each term is a product of the two functions as described below. The first one is a known function of the film and the substrate dielectric constants only. The second one, $\Delta p[]$, is some unknown function of the film thickness and the tip-to-sample separation only called a geometrical coefficient.

The magnitude of the geometrical coefficients can be found using a perturbation approach. If the charges are placed on the tip conductors in the absence of the sample, the surface charge density and potential in vacuum are $\sigma_e[x,y,z]$ and $p_e[x,y,z]$, respectively. If the semi-infinite dielectric or metallic sample with $\gamma_c=(\epsilon_c-1)/(\epsilon_c+1)$ is placed underneath the tip, the surface charge density on the tip conductors is $\sigma_c$. The potential $V_c$ in the vacuum space above the bulk sample due to $\sigma_c$ is given by W. R. Smythe, *Static and Dynamic Electricity*, McGraw-Hill, N.Y., 1968):

$V_c=p_c[x,y,z]-\gamma_c p_c[x,y,-(z-2d_c)]$ where $p_c[x, y, z]$ is the potential in vacuum due to the surface charge density $\sigma_c$ with no sample present. And for the tip fringe capacitance it is found $C_c^{-1}=\Delta p_c[0]-\gamma_c\Delta p_c[2d_c] \quad (6)$ Generally $\sigma, \sigma_e$, and $\sigma_c$ are different. However in the framework of the first order perturbation approach it is assumed that all surface charge distributions are the same and therefore $$p[x, y, z] = p_e[x, y, z] = p_c[x, y, z]$$

while the E-field depends on the sample dielectric properties and the tip-to-sample separation. Eqs. 5 and 6 can be rewritten as follows:

$$C_c^{-1} = \Delta p_e[0] - \gamma_f \Delta p_e[d] - \quad (7)$$

$$(1 - \gamma_f^2) \sum_{n=0}^{\infty} (-\gamma_f)^n \gamma_s^{n+1} \Delta p_e[d + t(n+1)]$$

$$C_c^{-1} = \Delta p_e[0] - \gamma_c \Delta p_e[d_c]$$

where $d$ and $d_c$ are the tip-to-sample separations for the dielectric layer sample under study and the bulk sample, respectively. By letting $$d_c = d, d + t(n+1), n = 0, 1, 2 \quad (8)$$

and taking into account that change in the probe resonant frequency $\Delta F = F_e - F$ is proportional to the change in $1/C_t$, e.g. $\Delta F \propto \Delta(1/C_t)$ equations (7) finally yield:

$$\Delta F_{ef}[d] = \gamma_c^{-1} \quad (9)$$

$$\left( \gamma_f \Delta F_{ec}[d] - (1 - \gamma_f^2) \sum_{n=0}^{\infty} (-\gamma_f)^n \gamma_s^{n+1} \Delta F_{ec}[d + t(n+1)] \right)$$

where $\Delta F_{ef} = F_e - F_f$, $\Delta F_{ec} = F_e - F_c$, $F_e$ is the probe resonant frequency with the empty resonator, $F_f$ is the probe resonant frequency for the dielectric layer sample at the tip-to-sample separation $d$, and $F_c$ is the probe resonant frequency for the bulk sample at the tip-to-sample separation given by Eq. (8).

Based on the presented theory, the method to quantitatively measure the dielectric constant of a dielectric layer backed by the metallic substrate is suggested using a semi-infinite dielectric or metallic sample with known dielectric constant as a calibration sample.

The Algorithm for measurements of dielectric constant of thin films on a metallic or arbitrary substrate is provided as follows:

Step 1. Adjust the tip-sample distance control unit 44 in a manner that it holds the probe tip 48 at some fixed distance $d_0$ above the sample 12 surface. Typically $d_0$ is in the range from 10 to 200 nm. Generally, the absolute value of this tip-sample separation is unknown. However, it is estimated, by measuring the distance control signal by the distance control mechanism 44 as a function of the tip-to-sample separation by means of the tip approaching the sample in the open feedback loop as described and as shown in FIG. 2. It is preferred to have $d_0$ on the order of or less than $1/10^{th}$ of the tip size $\alpha_t$.

Step 2. Perform calibration of the probe on a metallic-like film with $|k|>>1$, e.g., $\gamma=(k-1)/(k+1)=1$. A bulk calibration sample with very large dielectric constant $|k_m|>>1$ and $\gamma_m=1$ is used. It may be some high-k dielectric (such as TiO2 with k~100), metal (Al, Cu, W, etc.), or low resistivity silicon wafer. The probe frequency shift $\Delta F_m = F_e - F_m$ as a function of the tip-to-sample separation d for this sample is measured in the measurements electronics 24, shown in FIG. 2. $F_e$ is the empty resonant frequency that means the resonant frequency with no sample present. In practice, this means that the tip-sample separation d is greater than $3\alpha_t$.

Step 3. Perform calibration on air film with k=1. A bulk calibration sample with nominally the same dielectric permittivity as the substrate of the film under test can be used for this step. If the film under test is on metallic or highly conductive substrate, the same calibration sample as in Step 2 can be used. The probe frequency shift $\Delta F_{ea} = F_e - F_a$ is measured as a function of the tip-to-sample separation d for this calibration sample d varying from $d_0$ to $>3\alpha_t$.

Figure 4:
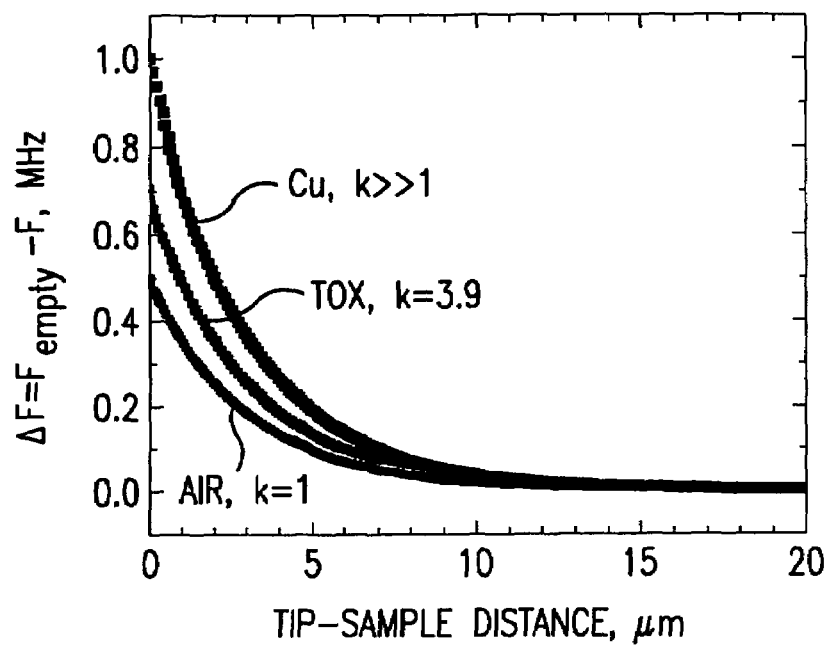
FIG. 4 shows a diagram of the probe resonance frequency shift $\Delta F$ vs. tip-sample distance for metallic-like film, $SiO_2$ film, and air.

Step 4. Calibration on $SiO_2$ films with k~4. Additionally, other dielectrics with known dielectric constants may be used. In fact, any film with a well-known dielectric constant that is close to the dielectric constant of the film under study may be used. The calibration materials may include (but not limited to) $SiO_2$, Teflon, sapphire, MgO, and other materials. However, as an example only, and not to limit the scope of the present invention, the calibration on $SiO_2$ films is described herein. A set of $SiO_2$ thin films are used with variable thickness ranging around the thickness of the film under test on nominally the same substrate as the film under test. If the film under test is on a highly conductive or metallic substrate then, preferably, $SiO_2$ should be thermally grown on highly conductive Si, since the k-value of such a thermal oxide (TOX) is well known: $k_{TOX} = 3.93 \pm 0.01$. However, alternatively, $SiO_2$ may be deposited by a CVD process (on a wide variety of substrates). The probe frequency shift $\Delta F_{TOX}$ is measured as a function of the tip-sample separation d for each of these samples for d varying from $d_0$ to $>3\alpha_t$. Steps 2-4 result in the diagram shown in in FIG. 4, presenting $\Delta F$ vs. d dependence for the calibration samples.

Step 5. For the thin film sample under study the probe frequency shift $\Delta F_{ef} = F_e - F_f$ is measured vs. the tip-sample separation varying from $d_0$ to $3\alpha_t$.

Step 6. Interpolate all of the above $\Delta F$ vs. d data using some standard interpolation method to construct a calibration curve shown in FIG. 5. It is also possible to fit the data to the functional form such as $2^{nd}$ or higher order exponential decay, or other with similar behavior. The result of this fit for the metallic calibration sample is the analytical function $F_m(d)$.

There are several calibration approaches envisioned in the scope of the present invention.

I. Non-Linear Calibration Curve, Theoretical Form

Step 7(I): After the Step 6, from Eq. (7) and the calibration analytical function $F_m(z)$ for the metallic calibration sample, the apparatus function is constructed for the probe frequency shift as follows:

$$F_f[d] = \gamma_c^{-1} \quad (10)$$

$$\left( \gamma_f F_m[d] + (1 - \gamma_f^2) \sum_{n=0}^{N} (-\gamma_f)^n \gamma_s^{n+1} F_m[d + t(n+1)] \right)$$

where N can be cut off at $\sim 3\alpha_t/2t$ due to the near-field nature of the probing E-field.

Step 8(I): Fit the function $F_f$ to the experimental data $\Delta F_{ef}$ using $\gamma_f$ as the fit free parameter. The substrate's $\gamma$, is known; for highly conductive substrate $\gamma_s = 1$.

Step 9(I): For each of the calibration thin films fit the apparatus function $F_f[d]$ to the experimental data $\Delta F$ using $\gamma_{fc}$ as the fit free parameter, similar to the Step 8(I). Generally, the resulting values $\gamma_{fc} \neq \gamma_{fc0}$. If more than one calibration thin film is used, construct the array from the pairs $\{t_{ci}, \gamma_{fci}\}$ and add the pair $\{0m\ \lambda_{fco}\}$ to it. Interpolate the result to find $\Gamma[t]$.

Step 10(I): If more than one calibration thin film is used construct the following array: $\{0, \Delta F_{es}\}, \{t_{c1}, \Delta F_{ec}[d_0, t_{c1}]\}, \{t_{c2}, \Delta F_{ec}[t_{c2}]\} \ldots$, where $\Delta F_{es}$ is the total frequency shift for the bulk sample with $\gamma_s$ (e.g. for $t_c=0$). From interpolation $\Delta F[t_f]$ is found.

Step 11(I): Construct the following array $\{\{0, \Delta F_{ea}[t_f]\}, \{\Gamma[t], \Delta F[t_f]\}, \{1, \Delta F_{em}\}\}$, $\Delta F_{em}$ which is the total frequency shift for the metallic sample. Fit it to the second order polynomial.

Step 12(I): Find the corrected $\gamma_{fcorr}$ and calculate the film dielectric constant $\epsilon_{rf}$ as follows:

$$\varepsilon_{rf} = \frac{-1 - \gamma_{fcorr}}{-1 + \gamma_{fcorr}}$$

It is readily apparent to those skilled in the art that the material's dielectric constant can be identified as $\epsilon$ or k. In the present application, $\epsilon$ and k are used for the identification of the dielectric constant of the samples and are used intermittently throughout the text.

II. Non-Linear Calibration Curve

Steps 1-6 are the same as in the Method I. In the Method II the probe is still calibrated by measuring resonant frequency shift $\Delta F = F_e - F$ for three "standard" calibration films of nominally the same thickness and on nominally the same substrate as the low-k film under test: $\Delta F_{ea}[t_f]$ for an air film with dielectric constant k=1; $\Delta F_{TOX}[t_f]$ for a thermal oxide film (TOX) with well-known dielectric constant $k_{TOX}=3.92$; and $\Delta F_{si}$ for a low-resistivity silicon wafer which effectively exhibits infinitely large dielectric constant k>>1 for the probe (Steps 1-6 above). $F_e$ is the probe resonant frequency with no sample, and F is the frequency measured at some distance $d_0$ above the film surface. The following step 7(II) is however distinct from steps 7(I)-12(I).

Step 7(II): In order to create a calibration curve $\Delta F$ vs. $\gamma=(k-1)/(k+1)$ of FIG. 5 (Curves A and/or C), which is generally dependent on the probe geometry and the low-k film thickness, the three calibration data points for frequency shift versus $\gamma$ are plotted and fitted to some functional form, such as $2^{nd}$ order polynomial or analytical function describing the tip behavior if known.

In order to determine the dielectric constant of the low-k film under test, the probe resonant frequency shift $F_{low-k}$ is measured and then converted into the k-value using the calibration fit function.

III. Linear Calibration Curve

Steps 1-6 are the same as in the methods (I) and (II). The following steps 7(III) -9(III) differ from the previous methods.

Figure 5:
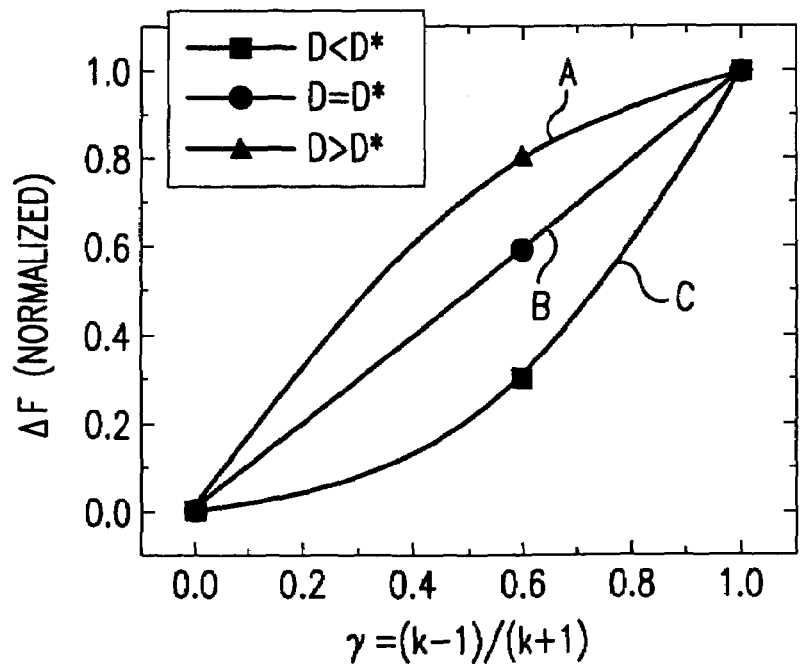
FIG. 5 is a diagram of the normalized frequency shift $\Delta F$ vs. $\gamma=(k-1)/(k+1)$ for a particular film thickness at three different tip-sample distances. As shown, for the tip-sample distance D*, the diagram B behaves linearly.

Step 7(III): Again, in order to create a calibration curve $\Delta F$ vs. $\gamma=(k-1)/(k+1)$ of FIG. 5, which is generally dependent on the probe geometry and the low-k film thickness, the three calibration data points for frequency shift vs. $\gamma$ are plotted. In this scenario, however, these points are plotted not only for the distance $d_0$ above the film surface but also for larger distances. It is noted that for a particular film thickness, the curvature of the frequency shift $\Delta F$ vs. $\gamma=(k-1)/(k+1)$ is a function of this tip-sample distance d. In fact, there is a "critical" distance $D^*$ at which $\Delta F$ vs. $\gamma=(k-1)/(k+1)$ is linear (FIG. 5, Diagram B). At $d<D^*$ the curvature is positive (FIG. 5, Diagram C), and at $d>D^*$ the curvature is negative (FIG. 5, Diagram A). Generally, $D^*$ is governed by the tip geometry and depends on the film thickness. $D^*$ is independent on k, however. Typically $D^* \leq t_f$. Using a set of data for a few calibration films with variable thickness from Step 4, $D^*$ vs. film thickness is determined, as presented in FIG. 6. This dependence is close to linear and from it $D^*$ may be found for any film thickness.

Figure 6:
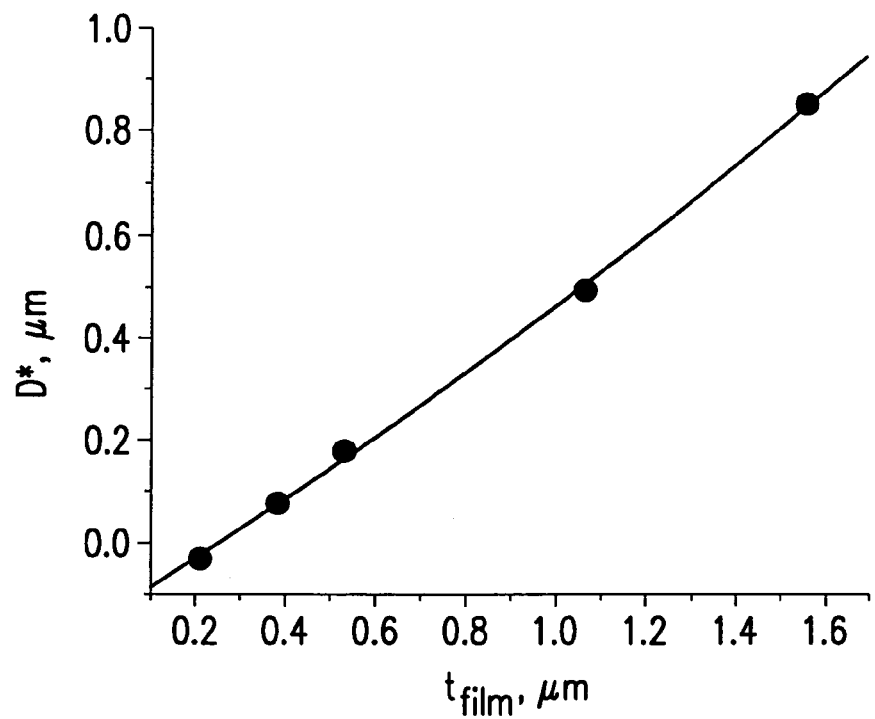
FIG. 6 is a plot showing the dependence of D* over the film thickness.

Specifically, in the Step 7(III), in order to determine the distance $D^*$, the probe resonant frequency shift $\Delta_{ec}$ vs. tip-sample separation is measured for a plurality of calibration films of different thicknesses, then a tip-sample separation $D_c^*$ at which said calibration curve measured for said plurality of calibration films behaves linearly is determined, further the dependence between the $D_c^*$ and the thickness of each of said calibration films is determined; and tip-sample separation $D_s^*$ corresponding to the thickness of the sample under study is obtained from the diagram of FIG. 6, based on the dependence between the $D_c^*$ and the thickness of the calibration films.

The calibration films are the films with a well-known dielectric constant that ranges around the dielectric constant of the film under study. The calibration material may include $SiO_2$, thermal oxide, Teflon, sapphire, MgO, and others.

Step 8(III): Further, $D^*$ for the film thickness $t_f$ of the sample under study is determined; and the probe resonance frequency shift $\Delta F_{ef}$ of the sample under study is measured at the tip-sample separation $D_s^*$.

Step 9(III): The calibration curve $\Delta F$ vs. $(k-1)/(k+1)$ at $D^*$ shown in FIG. 7 for the film thickness $t_f$ is linear. It is created from $\Delta F$ measurements on the air and metallic calibration films.

The data corresponding to the probe resonance frequency shift $\Delta F_{ef}$ of the sample under study measured at the tip-sample separation $D_s^*$ are fitted into the linear calibration curve B of FIG. 5 to obtain the dielectric constant k of the sample under study.

It is readily apparent to those skilled in the art that the linear calibration curve $\Delta F_{ec}$ vs. $\gamma=(k-1)/(k+1)$ of FIG. 5 is based on the calibration data points acquired as the result of calibration of the near-field microwave probe at the tip-sample separation $D_c^*$ for each calibration sample of the steps 2-4.

Figure 8:
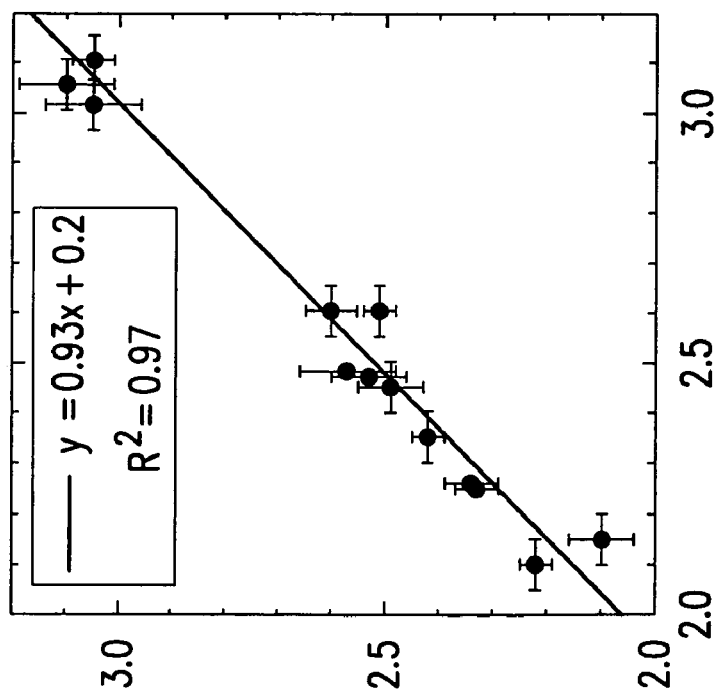
FIG. 8 is a diagram showing correlation between k values measured by the novel method and by Hg probe for low k films.

Using the instrument and technique of the present invention, the dielectric constant of 13 low-k films on Si substrates with $\rho<0.01\Omega\cdot cm$ are quantitatively measured. These samples are both SOD and CVD films with thicknesses ranging from 0.35 μm to 1.4 μm and dielectric constants ranging roughly from 2.1 to 3.1. For each film, the average dielectric constant across the wafer as measured by the new technique is compared to the values obtained by the conventional mercury probe. The correlation plot between the two data sets is shown in FIG. 8. The correlation is excellent with a correlation coefficient $R^2=0.97$. Although these data were all obtained on blanket wafers, the few-micron spot size and non-contact nature of the measurement essentially mean the technique may easily be applied to test regions in the scribe line on a product wafer.

Figure 9:
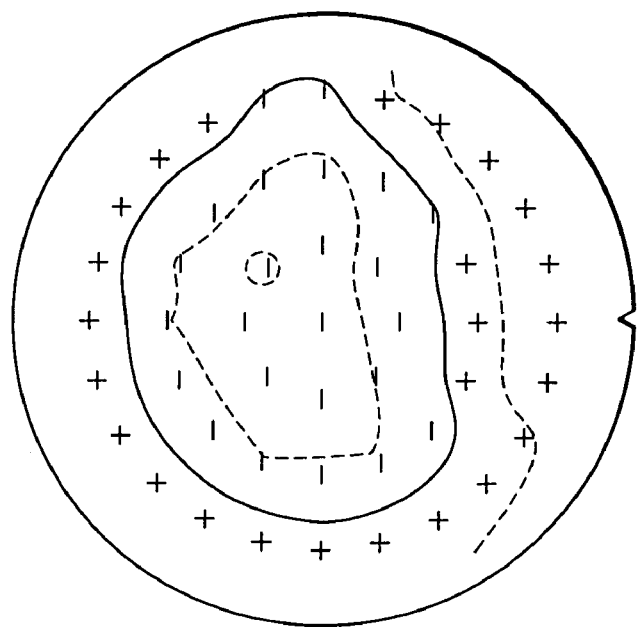
FIG. 9 is a schematic representation of a wafer map for a low k film on a 200 mm wafer. In this diagram, each measured point is represented as a + or −, indicating whether they are above or below the mean of 2.27.

In FIG. 9, a 49-point map of one of the low-k films on a 200 mm wafer is shown. Each measured point is represented as a + or − indicating whether they are above or below the mean of 2.27. The solid contour line indicates the position of the mean and the dashed lines are at plus and minus one standard deviation of 0.034.

The sample-to-sample repeatability of these measurements $\Delta k/k$ is currently ~2%. It is controlled primarily by the repeatability of the tip-sample separation. Estimates show that the practical limit can be as low as 0.1%. The accuracy of the measurements is currently ~5% and depends mainly on the accuracy of the empirical fit P(γ) for the frequency shift vs. γ.

Figure 10:
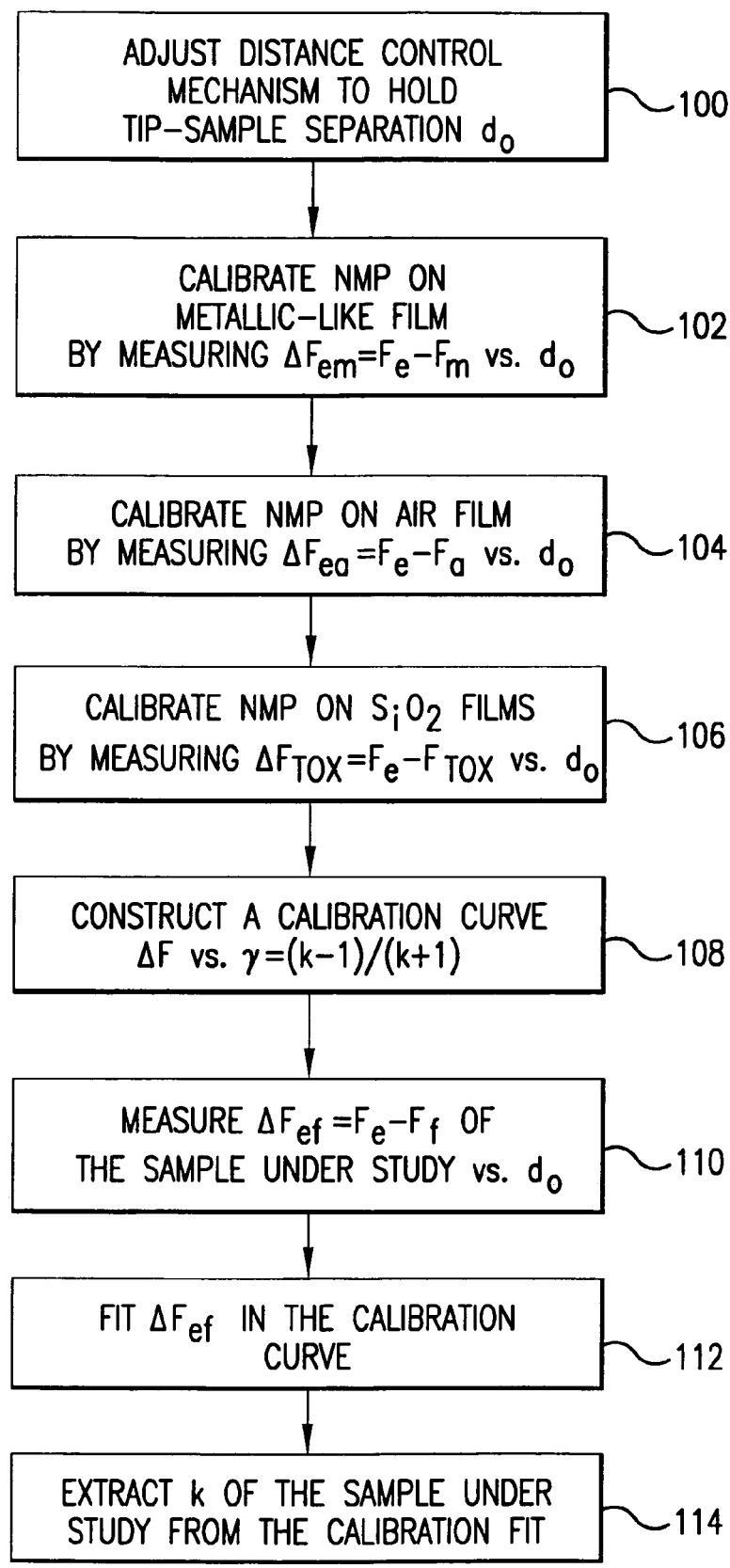
FIG. 10 is a flow-chart diagram of the processor algorithm of the present invention corresponding to calibration curves A and C of FIG. 5.

The system 10 operates in accordance with a novel software run by the data processor 42. FIG. 10 shows a flow chart diagram of the novel algorithm for measurement of dielectric constant of thin film on metallic or arbitrary substrate which uses a non-linear calibration curve. The procedure is initiated at block 100 "Adjust Distance Control Mechanism to Hold Tip-Sample Separation $d_0$" in which the tip sample distance control mechanism 44 is adjusted to hold the probe tip at some fixed distance $d_0$ above the sample surface. The absolute value of the tip-sample separation is unknown. However, it is estimated by measuring the distance control signal as a function of the tip-to-sample separation by means of the tip approaching the sample in the open feedback loop shown in FIG. 2.

Further, the procedure flows to block 102, "Calibrate NMP (Near Field Microwave Probe) on Metallic-Like Films by Measuring $\Delta F_{em}=F_e-F_m$ vs. $d_0$". In this block, a calibration bulk sample with a very large dielectric contant $k_m \gg 1$ and $\gamma_m=1$ is measured.

From block 102, the procedure flows to block 104 "Calibrate NMP on Air Film by Measuring $\Delta F_{ea}=F_e-F_a$ vs. $d_0$", where a bulk sample with nominally the same dielectric permittivity as the substrate of the film under test is measured. If the film under the test is a metallic or highly conductive substrate, the same calibration sample as in block 102, can be used.

The process further flows to box 106 "Calibrate NMP on $SiO_2$ Films by Measuring $\Delta F_{TOX}=F_e-F_{TOX}$ vs. $d_0$", where a set of $SiO_2$ thin films with variable thickness ranging around the thickness of the film under test on nominally the same substrate as the film under the test are measured. Instead of $SiO_2$, alternative materials such as TOX, Teflon, sapphire, MgO, and others may also be used.

All of the above ΔF vs. $d_0$ data are interpolated using some standard interpolation method. Further, the procedure passes to block 108 "Construct a Calibration Curve ΔF vs. γ=(k−1)/(k+1)". In order to create a calibration curve, which is generally dependent on the probe geometry and the low-k film thickness, the three calibration data points for probe resonant frequency shift vs. γ are plotted and fitted to some functional form such as second order polynomial or analytical function describing the tip behavior if known. In order to determine the dielectric constant of the low-k film under test, the probe resonant frequency shift $\Delta F_{ef}$ is measured in block 110 "Measure $\Delta F_{ef}=F_e-F_f$ of the sample under study vs. $d_0$".

In order to extract the dielectric constant k of the sample under study, the algorithm passes to the block 112, "Fit $\Delta F_{ef}$ in the Calibration Curve", and then in block 114, the procedure extracts the dielectric constant of the sample under study from the calibration fit function.

Figure 11:
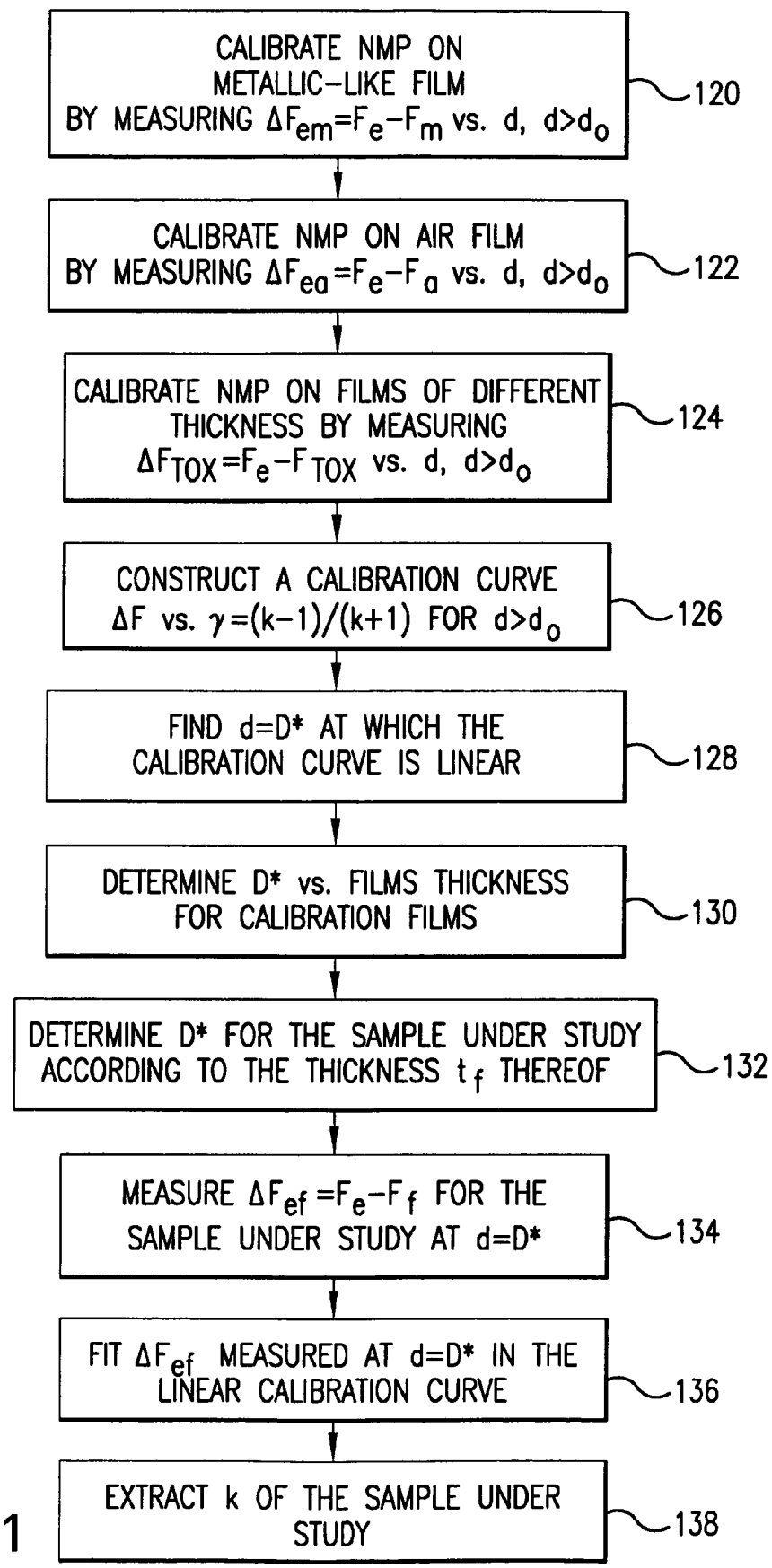
FIG. 11 is a flow-chart diagram of the algorithm of the present invention corresponding to a linear calibration curve B of FIG. 5.

The procedure of measurement of dielectric constant of a sample under study, particularly the calibration of NMP portions thereof can create a calibration curve exhibiting a linear behavior. The flow chart diagram of the "linear" approach is shown in FIG. 11, which starts with the block 120, "Calibrate NMP on Metallic-Like Films by Measuring $\Delta F_{em}=F_e-F_m$ vs. d, $d>d_0$". Further, the procedure flows to box 122, to calibrate the NMP on air films, again for the distance $d>d_0$. After the block 122, the algorithm passes to block 124 to calibrate the NMP on TOX films of different thicknesses by measuring resonance frequency shift as a function of d, where $d>d_0$.

As seen, blocks 120-124 of FIG. 11 are analogous to blocks 102-106 of FIG. 10, with the exception that the measurements of the resonant frequency shift are made vs. tip-sample separation larger than $d_0$. This means that the three calibration data points for frequency shift vs. γ (for the metallic-like film, air film, and $SiO_2$, etc. films) are plotted not only for the distance $d_0$ above the film surface, but also for larger distances. It was noted that for a particular film thickness, the dependence of the frequency shift ΔF vs. γ=(k−1)/(k+1) is a function of the tip-sample distance d. There is a critical distance D* at which ΔF vs. γ is linear. Generally, D* is governed by the tip geometry, depends on the film thickness, and d* is independent on dielectric constant k. Typically, D* is smaller or equal to $t_f$, the thickness of the sample under study. In order to determine D*, the algorithm of the present invention flows from block 124 to block 126 to construct a calibration curve ΔF vs. γ for $d>d_0$ and from this data, the distance D* is found in block 128 where the calibration curve is linear. Further, the block diagram passes to block 130 in which a set of data for calibration films ($SiO_2$, TOX, Teflon, sapphire, MgO, etc.) with variable thickness (as in block 124), the relationship between D* vs. film thickness is determined.

This dependence is close to linear, as shown in FIG. 6, and from this dependence, a critical distance D* can be found for any film thickness. For this, the algorithm flows to block 132 where the D* is determined for the sample under study according to the thickness $t_f$.

Further, a resonance frequency shift for the sample under study is measured at tip-sample separation D* determined in block 132.

Figure 7:
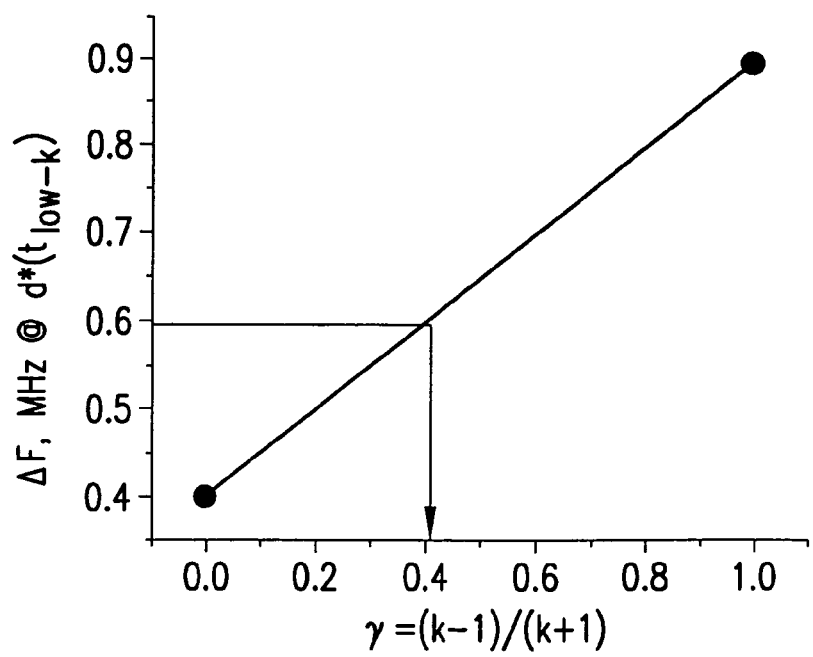
FIG. 7 represents a diagram showing a calibration curve for $\Delta F$ vs. $\gamma=(k-1)/(k+1)$ at tip-sample separation D*.

The calibration curve ΔF vs. γ=(k−1)/(k+1) at D* for the film thickness $t_f$ under study is linear, as shown in FIG. 7. This is created from ΔF measurements on the air and metallic calibration films taken in blocks 120 and 122 of FIG. 11. The procedure further passes to block 136 in which the measured $\Delta F_{ef}$ at D* is fit in the linear calibration curve, and in block 138, the film under study k value is determined.

A novel technique of the present invention was developed for measuring the dielectric constant of low-k films on Si or metallic substrates. The advantages of this new technique are as follows: a) it is non-contact, non-invasive and non-contaminating; b) it has high spatial resolution (on the order of a few microns, but potentially can be scaled below one micron); and c) the measurement is made at microwave frequencies (4 GHz in this example, but can be scaled up), which is well matched to the operating frequencies of the devices in which these materials are used. The non-contact nature and high spatial resolution of this technique make it particularly well suited for measurements on patterned wafers, and the high-frequency measurement provides information about material properties at device frequencies. With the current probe geometries, inhomogeneities in dielectric constant can be quantitatively imaged on a few microns scale, and efforts are underway to scale the probing area down to sub-micron dimensions.

The novel low-k dielectric methodology is based on a scanning near-field microwave probe. The main feature of the near-field approach is that the spatial resolution is defined by the probe tip geometry rather than by the wavelength of the radiation used. Therefore, even for microwave frequencies with wavelengths of centimeters, a near-field probe can achieve spatial resolution down to the sub-micron scale. The quantitative dielectric constant measurements on a variety of low-k dielectric films show excellent correlation with mercury probe measurements on the same films.

Although this invention has been described in connection with specific forms and embodiments thereof, it will be appreciated that various modifications other than those discussed above may be resorted to without departing from the spirit or scope of the invention as defined in the appended Claims. For example, equivalent elements may be substituted for those specifically shown and described, certain features may be used independently of other features, and in certain cases, particular locations of elements may be reversed or interposed, all without departing from the spirit or scope of the invention as defined in the appended Claims.

What is claimed is:

1. A method of measurement of a dielectric constant of a sample under study, comprising the steps of:
   (a) positioning the tip of a near-field microwave probe (NMP) a predetermined tip-sample separation distance over the surface of the sample under study, said NMP forming a resonator structure,
   (b) measuring probe resonant frequency shift $\Delta F_{ef} = F_e - F_f$ vs. said tip-sample separation, wherein $F_e$ is the probe resonance frequency of an empty resonator structure, and $F_f$ is the probe resonance frequency measured at said predetermined tip-sample separation distance of said probe tip and said sample under study,
   (c) calibrating said near-field microwave probe for a plurality of calibration samples, each said calibration sample having a respective dielectric constant $k_c$, by measuring probe resonant frequency shift $\Delta F_{ec} = F_e - F_c$ vs. a distance between said probe tip and said each of said plurality of calibration samples, wherein $F_e$ is the probe resonance frequency of said empty resonator structure, and $F_c$ is the probe resonant frequency measured at said distance between said probe tip and said each calibration sample held substantially equal to said predetermined tip-sample separation,
   (d) constructing a calibration curve $\Delta F_{ec}$ vs. $\gamma = (k_c - 1)/(k_c + 1)$ based on calibration data points acquired as the result of the calibrating of said near-field microwave probe for said plurality of calibration samples,
   (e) fitting said probe resonant frequency shift $\Delta F_{ef}$ of said sample under study into said calibration curve; and
   (f) extracting the dielectric constant $k_s$ of said sample under study therefrom.

2. The method of claim 1, wherein said plurality of calibration samples includes at least a calibration sample having $k_c \gg 1$.

3. The method of claim 1, wherein said plurality of calibration samples includes at least a calibration sample having $k_c$ substantially equal to dielectric permittivity of a substrate of said sample under test.

4. The method of claim 1, wherein said plurality of calibration samples includes at least a set of films of a variable thickness ranging around the thickness of said sample under study, said films having a well-known dielectric constant ranging around the dielectric constant of said sample under study.

5. The method of claim 1, wherein said plurality of calibration samples includes a metallic-like film with $k_c \gg 1$, an air film with $k=1$, and $SiO_2$ film with $k \sim 4$.

6. The method of claim 1, wherein said calibration curve is created as the result of interpolating said $\Delta F_{ec}$ vs. $\gamma = (k_c - 1)/(k_c + 1)$ calibration data point by a standard interpolation method.

7. The method of claim 1, wherein said calibration curve is created by fitting said $\Delta F_{ec}$ vs. $\gamma = (k_c - 1)/(k_c + 1)$ calibration data points to a $2^{nd}$ or higher order polynomial function.

8. The method of claim 1, wherein said calibration curve is created by fitting said $\Delta F_{ec}$ vs. $\gamma = (k_c - 1)/(k_c + 1)$ calibration data points to an analytical function describing behavior of the tip of said near-field microwave probe.

9. The method of claim 1, wherein said calibration curve is substantially a linear calibration curve.

10. The method of claim 9, further comprising the steps of:
    determining a tip-sample separation $D^*$ at which said calibration curve is linear, and
    measuring said probe resonant frequency shift $\Delta F_{ef}$ at said tip-sample separation $D^*$ over the surface of said sample under study.

11. The method of claim 9, further comprising the steps of:
    measuring said probe resonant frequency shift $\Delta F_{ec}$ vs. tip-sample separation for a plurality of calibration films of different thicknesses,
    determining a tip-sample separation $D_c^*$ at which said calibration curve measured for said plurality of calibration films behaves linearly,
    determining dependence between said $D_c^*$ and the thickness of each of said calibration films,
    determining tip-sample separation $D_s^*$ corresponding to the thickness of said sample under study based on said dependence between said $D_c^*$ and the thickness of said calibration films, and
    measuring said probe resonant frequency shift $\Delta F_{ef}$ of said sample under study at said tip-sample separation $D_s^*$.

12. The method of claim 11, further comprising the steps of:
    calibrating said near-field microwave probe at said respective tip-sample separation $D_c^*$ for each said calibration sample,
    constructing said linear calibration curve $\Delta F_{ec}$ vs $\gamma = (k_c - 1)/(k_c + 1)$ based on said calibration data points acquired as the result of said calibration of said near-field microwave probe at said tip-sample separation $D_c^*$ for each said calibration sample, and
    fitting said probe resonance frequency shift $\Delta F_{ef}$ of said sample under study measured at said tip-sample separation $D_s^*$ into said linear calibration curve to obtain said dielectric constant $k_s$ of said sample under study therefrom.

13. The method of claim 1, wherein said calibration curve is constructed from a function that is fit to the $\Delta F_{em}$ vs. said tip-sample separation for a metallic calibration sample.

14. A system for measurements of dielectric constant of a sample under study, comprising:
    a sample under study,
    a plurality of calibration samples,
    a near-field microwave probe having a tip,
    a distance control unit operatively coupled to said near-field microwave probe to control tip-sample separation,
    a measurement unit measuring resonance frequency shift of said near-field microwave probe for said sample under study and said plurality of calibration samples, and
    a processor coupled to said near-field microwave probe and said distance control unit to calculate the dielectric constant of said sample under study based on resonance frequency shift $\Delta F_{ef}$ and $\Delta F_{ec}$ measurement for said sample under study for said plurality of calibration samples, respectively, said processor comprising a calibration unit constructing a calibration curve $\Delta F_{ec}$ vs. $\gamma=(k_c-1)/(k_c+1)$ based on calibration data points acquired as the result of the calibration of said near-field microwave probe for said plurality of calibration samples wherein $\Delta F_{ec}=F_e-F_c$, $F_e$ is the probe resonance frequency of an empty resonator structure of said near-field microwave probe, $F_c$ is the probe resonance frequency measured for a respective calibration sample, and $k_c$ is a dielectric constant of said respective calibration sample.

15. The system of claim 14, wherein said calibration unit constructs said calibration curve based on measurements of said resonant frequency shift $\Delta F_{ec}$ vs. tip-sample separation for said plurality of calibration samples, and wherein said processor fits said resonance frequency shift $\Delta F_{ef}$ measured vs. tip-sample separation for said sample under study into said calibration curve to extract the dielectric constant $k_s$ of said sample under study therefrom.

16. The system of claim 14, wherein said near-field microwave probe includes a balanced two-conductor transmission line resonator structure, including at least a pair of conductors extending in spaced relationship therebetween and spaced by a dielectric media.

17. The system of claim 14, wherein said calibration unit determines a tip-sample separation D* at which said calibration curve is substantially a linear calibration curve.

18. The system of claim 17, further comprising a plurality of calibration films, each said calibration film having a respective thickness, wherein said calibration unit determines a tip-sample separation $D_c^*$ at which said calibration curve measured for said plurality of calibration films behaves linearly, constructs said linear calibration curve $\Delta F_{ec}$ vs. $\gamma=(k_c-1)/(k_c+1)$ based on said calibration data points acquired as the result of said calibration of said near-field microwave probe at said tip-sample separation $d^*_c$ for each said calibration sample;

determines dependence between said $D_c^*$ and the thickness of each of said calibration films, and determines tip-sample separation $D_s^*$ corresponding to the thickness of said sample under study based on said dependence between said $D_c^*$ and the thickness of said calibration films, wherein said processor fits said probe resonance frequency shift $\Delta F_{ef}$ of said sample under study measured at said tip-sample separation $D_s^*$ into said linear calibration curve to obtain said dielectric constant $k_s$ of said sample under study therefrom.

19. The system of claim 14, wherein said distance control unit includes a shear force distance control mechanism.

20. The system of claim 14, wherein said, sample under study includes a low-k thin film, and wherein said plurality of calibration samples includes calibration films, each calibration film being made of a material with a known dielectric constant from a group of materials consisting of $SiO_2$, thermal oxides, Teflon, sapphire, and MgO.

* * * * *